(12) United States Patent
Alpert et al.

(10) Patent No.: US 8,347,249 B2
(45) Date of Patent: Jan. 1, 2013

(54) INCREMENTAL TIMING OPTIMIZATION AND PLACEMENT

(75) Inventors: Charles J. Alpert, Cedar Park, TX (US); Zhuo Li, Cedar Park, TX (US); Gi-Joon Nam, Austin, TX (US); Shyam Ramji, Lagrangeville, NY (US); Jarrod A. Roy, Austin, TX (US); Natarajan Viswanathan, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 455 days.

(21) Appl. No.: 12/416,754

(22) Filed: Apr. 1, 2009

(65) Prior Publication Data

US 2010/0257498 A1     Oct. 7, 2010

(51) Int. Cl.
*G06F 9/455* (2006.01)
(52) U.S. Cl. .................. 716/113; 716/119; 716/136
(58) Field of Classification Search ............. 716/9, 113, 716/122, 119, 136
See application file for complete search history.

(56) References Cited

U.S. PATENT DOCUMENTS

| | | | | |
|---|---|---|---|---|
| 5,397,749 | A * | 3/1995 | Igarashi | 716/113 |
| 6,871,336 | B1 * | 3/2005 | Anderson | 716/122 |
| 7,318,210 | B1 | 1/2008 | Singh et al. | |
| 7,428,718 | B1 * | 9/2008 | Singh et al. | 716/119 |
| 7,467,369 | B2 * | 12/2008 | Alpert et al. | 716/122 |
| 2008/0127017 | A1 * | 5/2008 | Alpert et al. | 716/10 |
| 2010/0257498 | A1 * | 10/2010 | Alpert et al. | 716/6 |

OTHER PUBLICATIONS

Halpin et al.; Timing Driven Placement Using Physical Net Constraints; journal; 2001; pp. 780-783; Issue: 1-58113-297-2; DAC 2001; Las Vegas, NV, USA.

(Continued)

*Primary Examiner* — Thuan Do
*Assistant Examiner* — Mohammed Alam
(74) *Attorney, Agent, or Firm* — Eustus D. Nelson; Robert C. Rolnik

(57) ABSTRACT

Disclosed is a computer implemented method, data processing system, and computer program product to optimize, incrementally, a circuit design. An Electronic Design Automation (EDA) system receives a plurality of nets wherein each net is comprised of at least one pin. Each pin is linked to a net to form a path of at least a first pin and a second pin, wherein the first pin is a member of a first net. The second pin can be a member of a second net, and the path is associated with a slack. The EDA system determines whether the path is a critical path based on the slack. The EDA system reduces at least one wire length of the path, responsive to a determination that the path is a critical path. The EDA system moves a non-critical component in order to reduce at least one wire length of the nets that include pins of a non-critical component, responsive to reducing at least one wire length of the path, wherein the non-critical component lacks pins on a critical path. The EDA system legalizes the components on a net having a pin selected from the first pin and the second pin. The EDA system determines whether a component is a non-critical component. The EDA system, responsive to a determination that component is a non-critical component, legalizes the non-critical component. The EDA system incrementally optimizes a time delay of the plurality of paths, responsive to legalizing.

25 Claims, 5 Drawing Sheets

OTHER PUBLICATIONS

Luo et al.; A New LP Based Incremental Timing Driven Placement for High Pperformance Designs; journal; 2006; pp. 1115-1120; Issue: 1-59593-381-6; DAC 2006; San Francisco, CA, USA.

Ren et al.; Sensitivity Guided Net Weighting for Placement Driven Synthesis; journal; 2005; pp. 711-721; Issue: 0278-0070/0; IEEE.

Stenz, Guenter; Timing Driven Placement in Interaction with Netlist Transformations; 1997 International Symposium on Physical Design; ISBN: 0-89791-927-0.

Reda, Sherief; Effective Linear Programming Based Placement Methods; 2006 International Symposium on Physical Design; ISBN-1-559593-299-2.

Dutt, Shantanu; A Network-Flow Approach to Timing-Driven Incremental Placement for ASICs; International Conference on Computer-aided Design; 2006; ISBN: 1-59593-389-1.

* cited by examiner

INCREMENTAL TIMING OPTIMIZATION AND PLACEMENT

BACKGROUND OF THE INVENTION

1. Field of the Invention

The present invention relates generally to a computer implemented method, data processing system, and computer program product for electronic design automation (EDA) in the design of integrated circuits. More specifically, the present invention relates to the placement of objects in an integrated circuit design and performing timing optimization on the design to satisfy design constraints.

2. Description of the Related Art

Organizing circuits on a substrate of a semiconductor is a task that can achieve efficiencies in overall circuit speed when electronic design automation instructions are processed on a data processing system to reduce delays in circuit operation. The chief source of delay within a Very Large Scale Integrated (VLSI) circuit design is the time delay associated with signals traveling from one component to another. Time delay is a value determined for a wire based on the wire's resistance and capacitance in relation to the substrate to which it is coupled. For a given substrate and a given wire width, time delay is proportional to the length of the wire. Time delay can be a term that applies to a path that interconnects multiple components in a path. Time delay can be a term applied to plurality of paths that make up a circuit design.

A path is a geometric description of the interconnect between a set of pins or endpoints of one or more nets. A net is a subset of components in an integrated circuit design as well as the interconnection of the pins of the subset of components. Each path is associated with a path delay or timing delay. The path may pass through a net associated with a first component, and a net of a second component. The path can be a 2-pin net. Thus, the path may link two or more components together by including at least one endpoint or pin of each component. A pin is an input or an output wire to a component. A netlist describes all the components in a design, and describes how these components or pins on the components are interconnected. The netlist may be described in a text file that corresponds to the component. The netlist may be a derivative, through additional processing, of a file format that may be as described by Verilog®, VHSIC Hardware Design Language (VHDL), among other high-level design languages. Verilog is a trademark of Cadence Design Systems.

Early in the design process, a designer may establish an upper limit for tolerable delays in the communication along a path. The tolerable delay becomes a factor in determining whether a threshold number of iterative steps to improve time delay has been reached on the path level, as well as for the overall circuit design.

SUMMARY OF THE INVENTION

The present invention provides a computer implemented method, data processing system, and computer program product to incrementally optimize a circuit design. An Electronic Design Automation (EDA) system receives a plurality of nets wherein each net is comprised of at least one pin. Each pin is linked to a net to form a path of at least a first pin and a second pin, wherein the first pin is a member of a first net. The second pin can be a member of a second net, and the path is associated with a slack. The EDA system determines whether the path is a critical path based on the slack. The EDA system reduces at least one wire length of the path, responsive to a determination that the path is a critical path. The EDA system moves a non-critical component in order to reduce at least one wire length of the nets that include pins of a non-critical component, responsive to reducing at least one wire length of the path, wherein the non-critical component lacks pins on a critical path. The EDA system legalizes the components on a net having a pin selected from the first pin and the second pin. The EDA system determines whether a component is a non-critical component. The EDA system, responsive to a determination that component is a non-critical component, legalizes the non-critical component. The EDA system incrementally optimizes a time delay of the plurality of paths, responsive to legalizing.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
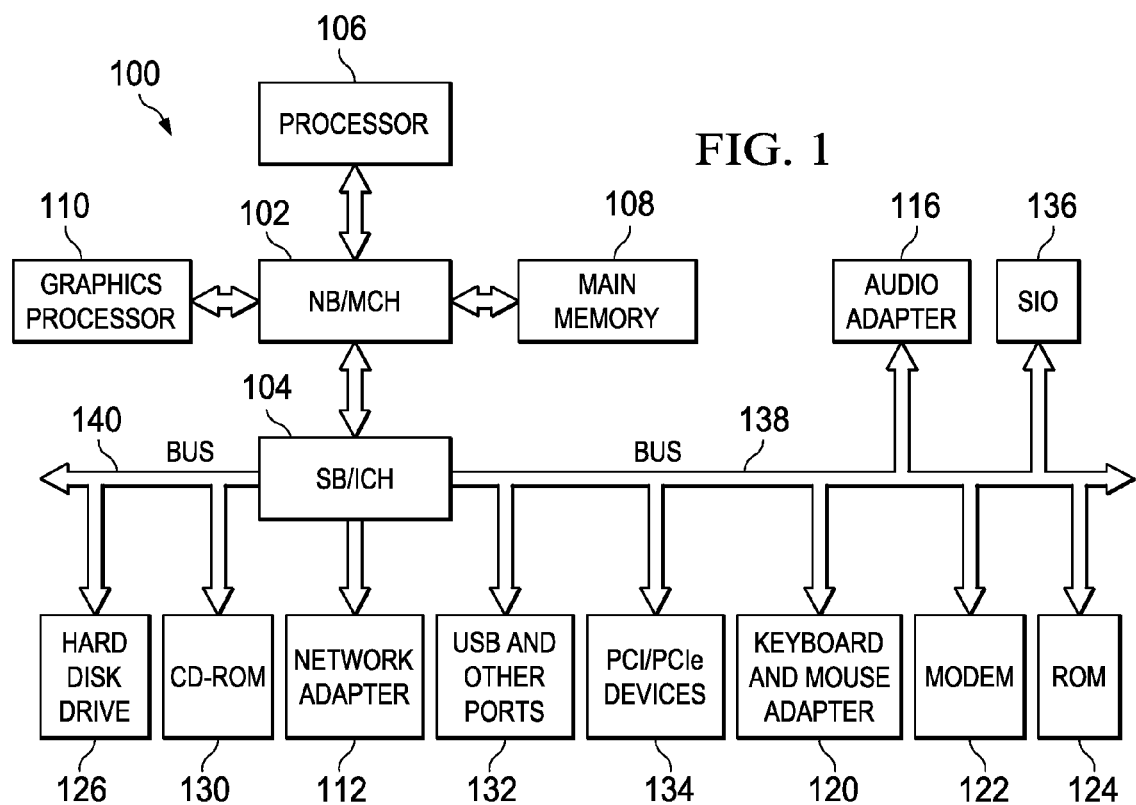
FIG. 1 is a data processing system in accordance with an illustrative embodiment of the invention.

With reference now to the figures and in particular with reference to FIG. 1, a block diagram of a data processing system is shown in which aspects of an illustrative embodiment may be implemented. Data processing system 100 is an example of a computer, in which code or instructions implementing the processes of the present invention may be located. In the depicted example, data processing system 100 employs a hub architecture including a north bridge and memory controller hub (NB/MCH) 102 and a south bridge and input/output (I/O) controller hub (SB/ICH) 104. Processor 106, main memory 108, and graphics processor 110 connect to north bridge and memory controller hub 102. Graphics processor 110 may connect to the NB/MCH through an accelerated graphics port (AGP), for example.

In the depicted example, local area network (LAN) adapter 112 connects to south bridge and I/O controller hub 104 and audio adapter 116, keyboard and mouse adapter 120, modem 122, read only memory (ROM) 124, hard disk drive (HDD) 126, CD-ROM drive 130, universal serial bus (USB) ports and other communications ports 132, and PCI/PCIe devices 134 connect to south bridge and I/O controller hub 104 through bus 138 and bus 140. PCI/PCIe devices may include, for example, Ethernet adapters, add-in cards, and PC cards for notebook computers. PCI uses a card bus controller, while PCIe does not. ROM 124 may be, for example, a flash binary input/output system (BIOS). Hard disk drive 126 and CD-ROM drive 130 may use, for example, an integrated drive electronics (IDE) or serial advanced technology attachment (SATA) interface. A super I/O (SIO) device 136 may be connected to south bridge and I/O controller hub 104.

An operating system runs on processor 106 and coordinates and provides control of various components within data processing system 100 in FIG. 1. The operating system may be a commercially available operating system such as Microsoft® Windows® XP. Microsoft and Windows are trademarks of Microsoft Corporation in the United States, other countries, or both. An object oriented programming system, such as the Java™ programming system, may run in conjunction with the operating system and provides calls to the operating system from Java™ programs or applications executing on data processing system 100. Java™ is a trademark of Sun Microsystems, Inc. in the United States, other countries, or both.

Instructions for the operating system, the object-oriented programming system, and applications or programs are located on storage devices, such as hard disk drive 126, and may be loaded into main memory 108 for execution by processor 106. The processes of the present invention can be performed by processor 106 using computer implemented instructions, which may be located in a memory such as, for example, main memory 108, read only memory 124, or in one or more peripheral devices.

Those of ordinary skill in the art will appreciate that the hardware in FIG. 1 may vary depending on the implementation. Other internal hardware or peripheral devices, such as flash memory, equivalent non-volatile memory, and the like, may be used in addition to or in place of the hardware depicted in FIG. 1. In addition, the processes of the illustrative embodiments may be applied to a multiprocessor data processing system.

In some illustrative examples, data processing system 100 may be a personal digital assistant (PDA), which is configured with flash memory to provide non-volatile memory for storing operating system files and/or user-generated data. A bus system may be comprised of one or more buses, such as a system bus, an I/O bus and a PCI bus. Of course, the bus system may be implemented using any type of communications fabric or architecture that provides for a transfer of data between different components or devices attached to the fabric or architecture. A communication unit may include one or more devices used to transmit and receive data, such as a modem or a network adapter. A memory may be, for example, main memory 108 or a cache such as found in north bridge and memory controller hub 102. A processing unit may include one or more processors or CPUs. The depicted example in FIG. 1 is not meant to imply architectural limitations. For example, data processing system 100 also may be a tablet computer, laptop computer, or telephone device in addition to taking the form of a PDA.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module", or "system." Furthermore, the present invention may take the form of a computer program product embodied in any tangible medium of expression having computer usable program code embodied in the medium.

Any combination of one or more computer usable or computer readable medium(s) may be utilized. The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, a transmission media such as those supporting the Internet or an intranet, or a magnetic storage device. Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory. In the context of this document, a computer-usable or computer-readable medium may be any medium that can contain, store, communicate, propagate, or transport the program for use by or in connection with the instruction execution system, apparatus, or device. The computer-usable medium may include a propagated data signal with the computer-usable program code embodied therewith, either in baseband or as part of a carrier wave. The computer usable program code may be transmitted using any appropriate medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable medium that can direct a computer or other programmable data processing apparatus to function in a particular manner, such that the instructions stored in the computer-readable medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The aspects of the illustrative embodiments provide a computer implemented method, data processing system, and computer program product for incrementally placing components in an integrated circuit design. Placement in a manner that gives priority to critical components when minimizing wire length can improve figures of merit, among other measures of circuit design quality, for an overall circuit design. Accordingly, by accounting for criticality of paths that link components as well as criticality of the components themselves, circuits that receive designations of physical locations by data processing systems of the illustrative embodiments can perform better than circuits receiving placement and routing by data processing systems of the prior art.

Figure 2A:
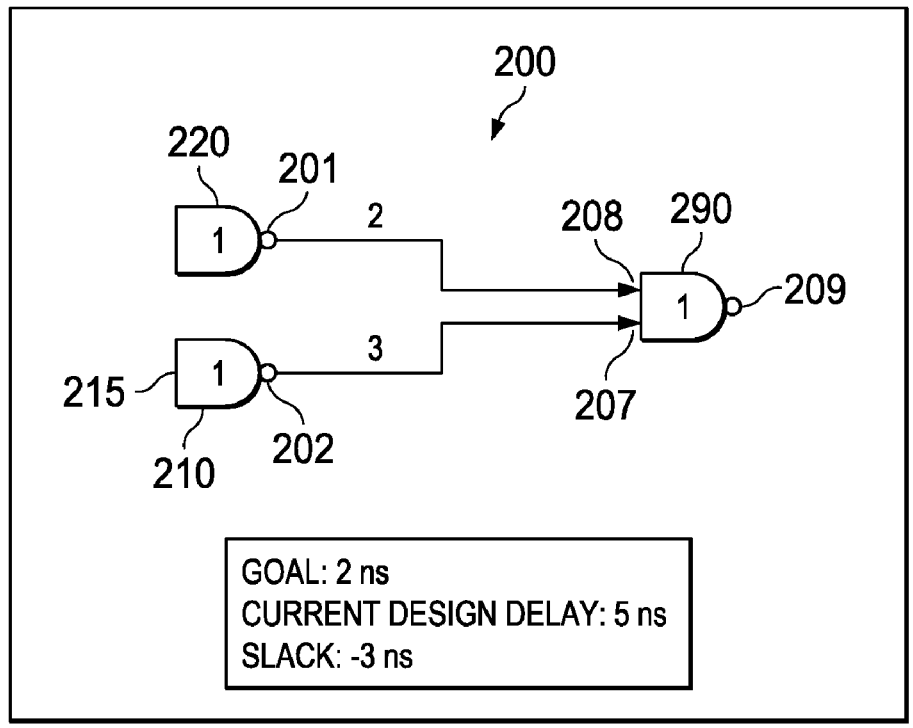
FIGS. 2A and 2B are arrangements of two exemplary components that may be subject to design optimization in accordance with an illustrative embodiment of the invention.
Figure 2B:
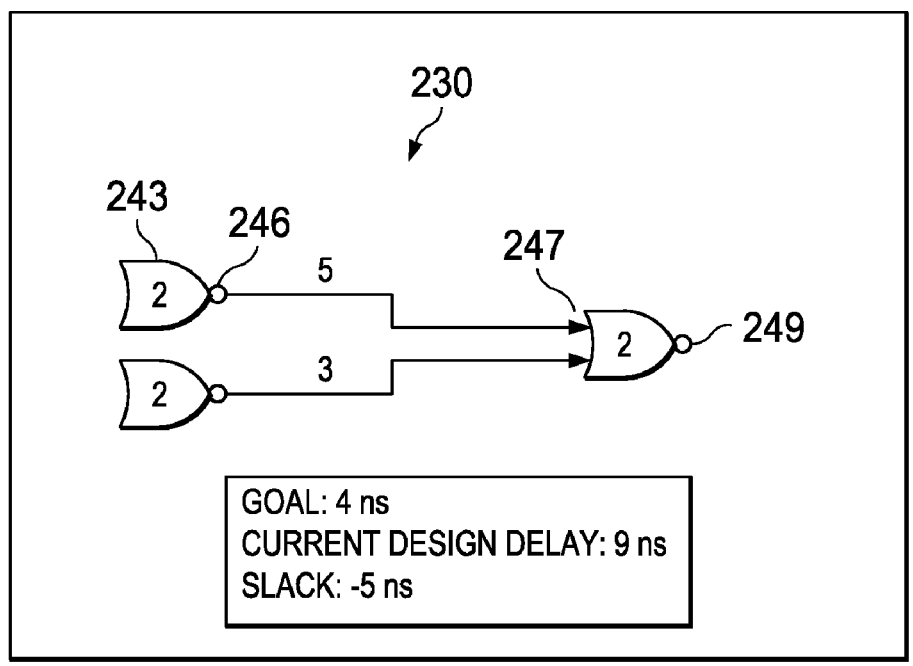

FIGS. 2A and 2B are arrangements of two exemplary components that may be subject to design optimization in accordance with an illustrative embodiment of the invention. A design may seek to link three components together. A component or object is an active switchable circuit in an integrated circuit. A component can be, for example, a gate, a buffer, a register, or a counter, among other circuits. In FIG. 2A, three components are depicted in circuit design 200, namely, NAND gate 210, NAND gate 220 and NAND gate 290. Each NAND gate is comprised of a pin list. A pin list is a description of the pin locations that are inputs and outputs to a component. The pin lists of two or more components may form a net. The pin locations may be identified as locations relative to each other, or in any other manner, that defines a possible geometry of the component.

Within the design that expresses the circuit as a connection between NAND gate 220 and NAND gate 290, is a path that has a path delay, of, in this case, 5 nanoseconds. One nanosecond of delay occurs because of delays internal to each gate. A delay of 3 nanoseconds occurs because of the wire length that links NAND output 202 to NAND input 207. A delay of 2 nanoseconds occurs between the wire length that links NAND output 201 to NAND input 208. The overall delay of the path is the sum of the internal delays and the interconnect delay, or 5 nanoseconds. A wire length is the length of a conductor that connects two pins.

A timing analysis tool can be run to determine the path delay. The path delay can include the sum of propagation delays between endpoints of two components, as well as the delay resulting from the operation of the components. Each time a data processing system reroutes or otherwise impacts delay of a circuit, the timing analysis tool may be used to establish a new delay for the path. One of the steps that illustrative embodiments may perform is determining whether all the paths have met the timing requirements. Such timing requirements, or goals, are set by circuit designers in accordance with design objectives that may emphasize speed in circuit operation in one path, but comparatively, emphasize speed less in a second circuit's operation along a second path.

Thus, in circuit design 200, the goal for the path from NAND input 215 to NAND output 209 may be 2 nanoseconds. Thus, the current design falls short of the goal by 3 nanoseconds. Designers call this shortcoming slack. Slack of a path is the time to propagate a signal through the path minus the time that the designer set as a design goal for the path. Accordingly, slack is based on the designer's tolerance for delay in a path and the actual delay predicted for the current placement of components that comprise endpoints of the path. Endpoints used in slack calculations by a timing analysis tool may fit into three categories: (a) primary input (PI) of the design; (b) a sequential element like a latch or flip-flop; and (c) primary output (PO) of the design. There can be multiple paths between: (i) a PI and a latch/flip-flop; (ii) a latch/flip-flop to another latch/flip-flop; (iii) a latch/flip-flop to a PO; or (iv) PI to PO. Each path can contain combinational components like AND, OR, NAND, NOR, buffers, among others.

FIG. 2B is an arrangement of two further components that may be modified by a data processing system embodiment. For example, in circuit 230 a path that includes NOR gate input 243, NOR gate output 246, NOR gate input 247 and NOR gate output 249 may have a timing delay of 9 nanoseconds as compared to a design goal of 4 nanoseconds. Accordingly, the slack for this circuit is −5 nanoseconds.

A critical path is a path that falls below a criticality threshold based on slack. The relationship between slack and criticality is an inverse relationship—the more negative the slack for a path, the more critical the path is. Accordingly, in the example given, if the circuit 200 and circuit 230 belong to the same design, then circuit 230 would be more critical than circuit 200. A path's criticality can be determined in several ways. First, all paths with a negative slack value can be considered critical. Second, all paths below a criticality threshold can be considered critical. As an example, of the second way of determining critical paths, a threshold can be −4. In which case, circuit 230 satisfies the determination that −5 slack associated with the circuit is below the threshold value. Accordingly, circuit 230 is on a critical path based on this criterion. It is appreciated that the criticality threshold can also be a positive value in circumstances where a designer chooses to further optimize non-negative paths.

Figure 3A:
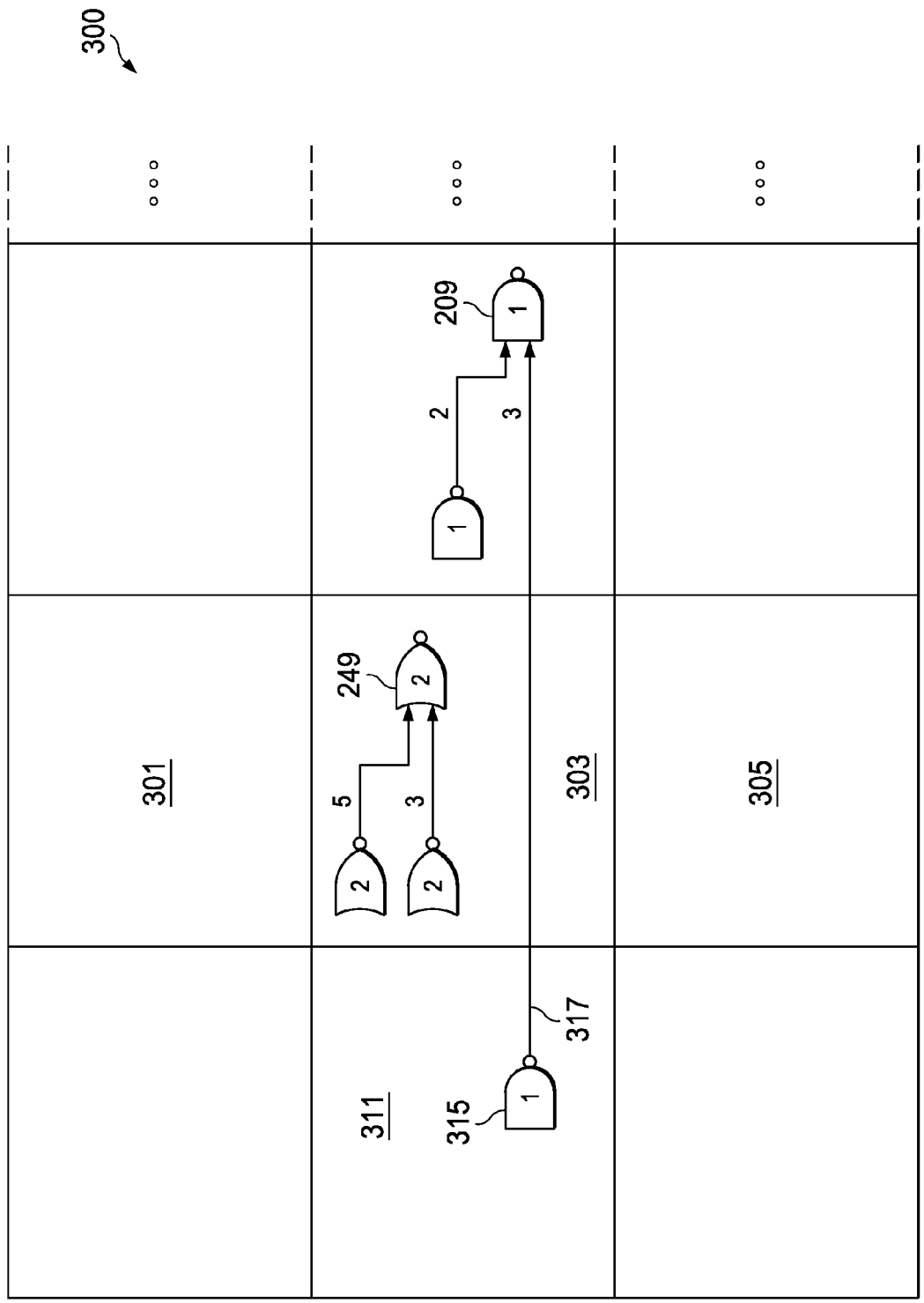
FIG. 3A is an example of initial circuit placement in accordance with an illustrative embodiment of the invention.

FIG. 3A is an example of initial circuit placement in accordance with an illustrative embodiment of the invention. Initially, an Electronic Design Automation (EDA) system may receive circuit data in the form of a netlist. The EDA system can be, for example, data processing system 100 of FIG. 1. It is appreciated that data processing system 100 can be one of several data processing systems that are networked together to achieve parallelism in executing instructions. Shown on die 300 is six circuits, each having their respective net lists. The circuits shown here can be groupings of circuits shown in FIGS. 2A and 2B. Each circuit grouping can result in output 249 and output 209, corresponding to NOR gate output 249 and NAND gate output 209, of FIG. 2B and FIG. 2A, respectively. Segment 317 is a part of the critical path that initially may have a slack of −3 ns. A segment or two-pin net is a point-to-point wire connecting two pins. Bins 301, 311, and 305 are available if an EDA system requires an adjacent bin to move components from bin 303. For example, a movement of NAND 315 into bin 303 for purposes of reducing critical path length, may displace a component from bin 303 to bin 301. Movement of components between bins is one way to improve congestion in relation to the bin that is the source of the component. Nevertheless, alternative approaches to relieving congestion are available, and further embodiments are within the scope of the invention in addition to those that rely on movement of components among bins to achieve congestion goals.

Figure 3B:
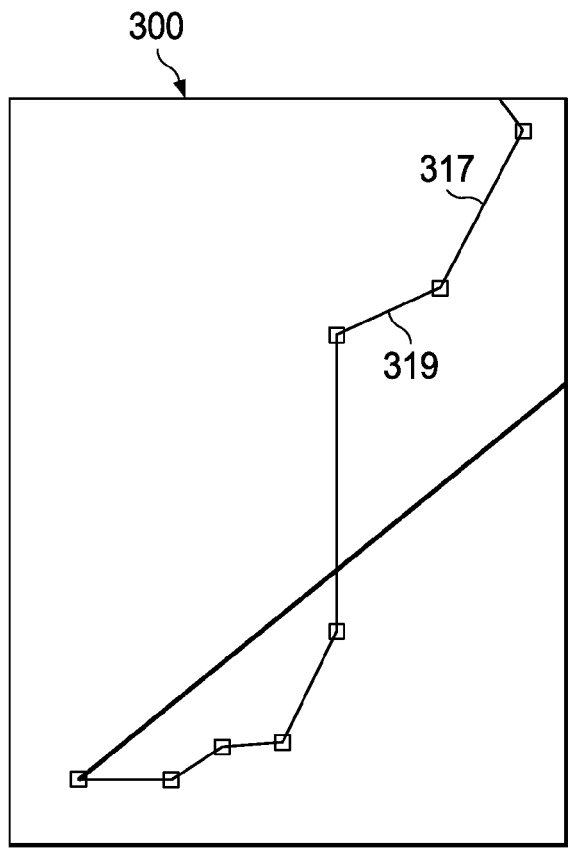
FIG. 3B and 3C are examples of paths created from an initial circuit placement in accordance with an illustrative embodiment of the invention.

FIG. 3B is an example of a path created from an initial circuit placement in accordance with an illustrative embodiment of the invention. Die 300 is shown with a path having many segments. Two segments are adjacent to each other, namely segment 317 and segment 319. Segment 317 corresponds to segment 317 of FIG. 3A. Segment 319 may be a segment that has as an endpoint NAND gate output 209 of FIGS. 2A and 3A.

Figure 3C:
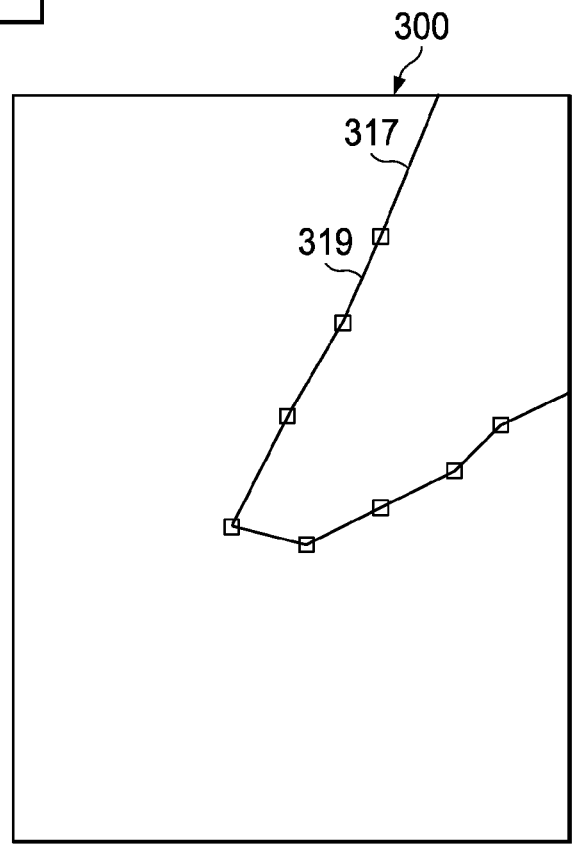

FIG. 3C is an example of a path created and further refined in accordance with an illustrative embodiment of the invention. Die 300 is a circuit design that may have been incrementally modified from FIG. 3B die 300. Segments 317 and 319 are arranged by a data processing system to have shorter wirelengths than as shown in FIG. 3B. In addition, a change in slope from segment 317 to segment 319 is reduced in FIG. 3C as compared to the change in slope from segment 317 to segment 319 in FIG. 3B. Adjacent segments are segments that have a common pin as an endpoint to each segment. Accordingly, both segments have the same pin as a member of each segment's endpoints. A change in slope between adjacent segments is an angle that a first segment deviates from a second segment's direction. For example, if a first segment extends along a 45-degree angle from a line that parallels an axis of a die, and the second segment extends from the first segment at a 40-degree angle from a line that parallels an axis of the die, the change in slope (or direction) is five degrees.

Figure 4:
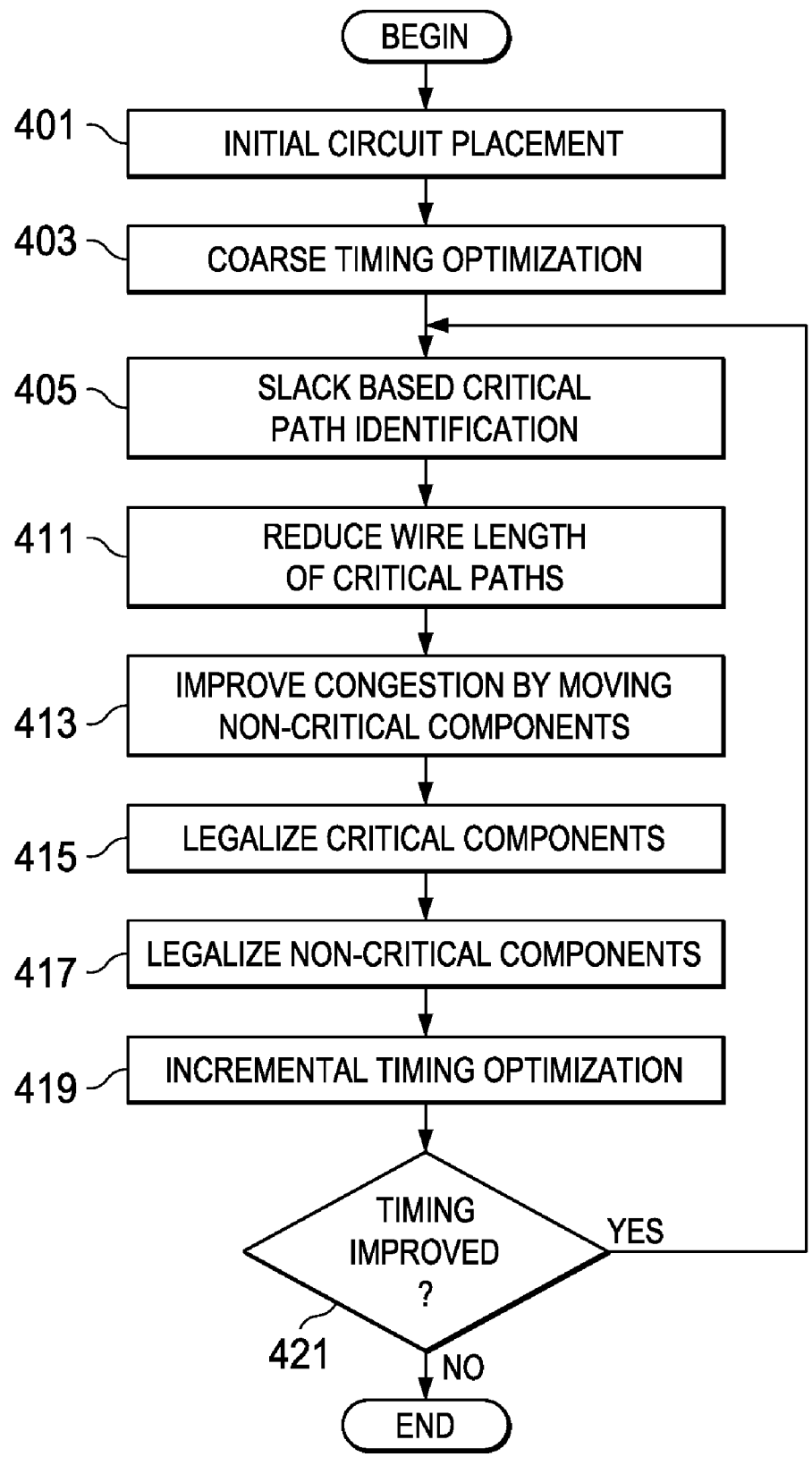
FIG. 4 is a flowchart of an incremental placement and timing optimization operation in a data processing system in accordance with an illustrative embodiment of the invention.

FIG. 4 is a flowchart of an incremental placement and timing optimization operation in a data processing system in accordance with an illustrative embodiment of the invention. The steps of the flowchart may be performed by an electronic design automation (EDA) system. The EDA system may be, for example, data processing system of FIG. 1. EDA system may initially perform initial circuit placement based (step 401). The circuit placement may operate on a plurality of nets, and can comprise placing the movable objects or components in the design on the die. Next, EDA system may perform coarse timing optimization (step 403). During step 403, the EDA system timing optimization on the entire design. As such, the EDA system performs this step as a "global" timing optimization step in the sense that all components are updated. In addition, the EDA system performs the timing optimization in a "coarse" manner in the sense that EDA system runs a limited set of timing optimization transforms to solve a subset of the timing issues in the design.

In contrast, steps 405-417 cooperate together, as a first sub-process, to perform incremental placement in the sense that components and/or paths may be selected as a subset of all components. Such a subset is further adjusted or moved during each iteration of these steps. Similarly, step 419, a second sub-process explained below, is an incremental optimization step where only portions of the entire design are optimized. Accordingly, step 419's incremental optimization changes critical paths in the design in order to improve or optimize such paths and associated components for timing.

Steps 405-417 may form a first sub-process to incrementally place some components of the design. Next, the EDA system may perform slack based critical path identification (step 405). The slack may be determined in the manner described above. For example, one path may have a slack of −5 nanoseconds and another circuit path may have a slack of −3 nanoseconds. Consequently, some paths are selected or determined to be critical paths for the next step.

For a given critical path in the set of critical paths identified above, the components on the path are linked to each other via two-pin nets. Based on the slack value for the path, these two-pin nets are assigned a net-weight to reflect the timing criticality of the path. Two-pin nets may be assigned net-weights between, e.g., 10 and 100, with 100 indicating a high net-weight or criticality. A net-weight corresponds to the value obtained by shortening a two-pin net's wire length. Accordingly, establishing high net-weight nets may be used to path thread one or more two-pin nets into a path that is a critical path. Such a critical path, and components along it, may be used by one or more among steps 411-417 to incrementally place one or more critical components.

Next, the EDA system may reduce wire lengths of critical paths (step 411). Step 411 can involve moving non-critical components to improve congestion.

Components that have pins within a critical path are critical components. In other words, a critical component has a pin within a set of pins that are members of at least one critical path. Accordingly, next, the EDA system may improve congestion by moving non-critical components (step 413). A non-critical component is a component that lacks pins on a critical path. The movement of the non-critical components to improve congestion can be in response to the movement of the critical component in step 411.

A designer of the circuit may establish criteria for determining the presence of congestion. Congestion is a condition that for a given area or region of a circuit design, for example, a bin, a metric is above a threshold. For example, a designer may set a threshold number of pins that is allowable within a bin of some pre-defined bin-grid. When an EDA system determines that a bin surpasses the threshold number, the EDA system may determine that the bin is congested. The threshold number of pins is a designer set value by which the EDA system determines congestion for an area of the die. The EDA system may select a subset of non-critical components for movement, for example, based on such non-critical components contributing to congestion. It is appreciated that additional ways of determining congestion may also be used to determine whether a region is congested. More specifically, the EDA system can determine whether congestion arises because of a net having a pin as a member of the second path. Furthermore, a congestion metric can be based on wires, pins, component area or a combination of these values. For example, the EDA system may determine congestion based on a subset of pins, that includes a net, exceeds a threshold number of pins in a bin to which the subset is assigned. Consequently, a component can be moved to an adjacent bin in order to lower congestion in the originating bin.

Next, the EDA system may move a non-critical component (step 413). As a result, the EDA system may reduce at least one wire length of a non-critical component while improving congestion, in response to the step 411 reducing of at least one wire length of the critical path. A wire length of a non-critical component is a wire length on a net or path that includes at least one pin of the non-critical component. Step 413 can include moving the non-critical component to improve the wire length of one or more nets on the component. Moving the non-critical component can include the EDA system moving the non-critical component to a bin adjacent the currently assigned bin. The currently assigned bin is a bin that the component is assigned for a given iteration of the loop of steps that circulates through step 405 and step 421.

Next, the EDA system may legalize a critical component (step 415). Legalizing can include applying one or more rules concerning feature spacing to components. A rule is a criteria or design constraint. The rules can include the tasks of (a) in standard-cell based designs, aligning or snapping the components (or standard-cells) to the circuit rows in the design; and/or (b) setting the proper orientation for the components, (c) assuring that no two components in the circuit netlist overlap each other, etc. Next, the EDA system may determine whether a component has a net within a critical path. In so doing, the EDA system may determine non-critical components. In response to determining the non-critical components, the EDA system may legalize at least one non-critical component (step 417).

A second sub-process for incremental timing optimization may be performed. Next, the EDA system may incrementally optimize time delay of a plurality of paths (step 419). Step 419 can include the EDA system performing an incremental timing analysis of the paths in the netlist. In addition, among those paths determined to be critical paths in the first sub-process, the EDA system may also perform a sub-process to optimize such critical paths. The critical paths determined in the first sub-process may be different from what was obtained prior to step 405. Since a criticality threshold divides the critical paths from the non-critical paths, the EDA system only applies timing optimization to a subset of all the paths in the design. Incrementally optimizing time delay can include buffer insertion, gate sizing, among other EDA processes. Next, the EDA system may determine if timing has improved (step 421). This determination can include determining if the path delay of all paths in a circuit design has improved from an earlier stage in processing through to a later stage in processing. The early stage in processing may be the design status as existed immediately prior to step 411.

Alternatively, the early stage in processing may be the design status as existed at a time multiple iterations prior to a present iteration through a loop of processing steps. For example, steps 405, 411, 413, 415, 417, 419, and 421, comprise a loop. As such, the EDA tool may apply a timing threshold. A timing threshold is an improvement goal set by a circuit designer to determine when to exit a loop. A timing threshold can be a minimum number of improvements in timing during a predetermined number of iterations. A predetermined number of iterations is a designer set criterion for exiting the loop or any other criterion set based on the designer input. In other words, at each pass through step 421, first a determination is made, comparing the present iteration to a next earlier iteration, whether a timing improvement occurred. A second determination can then be made whether the EDA system improved a minimum number of improvements during a predetermined number of iterations. A failure to improve at least the minimum number of improvements can cause a negative determination to occur at step 421. For example, if the predetermined number of iterations is 2, and the minimum number of improvements is 1, then a positive determination is made if a single timing non-improvement occurs in a sequence of two improvement measurements.

A negative determination at step 421 causes processing to terminate. However, a positive determination at step 421 can signal that adequate progress is occurring in improving the overall timing of the circuit design. Accordingly, processing may resume at step 405, and continue at steps 411 through step 421 to perform another iteration of processing steps.

The illustrative embodiments permit a circuit designer to specify design goals for a circuit design to an EDA system. The EDA system may respond to such goals by performing incremental timing-driven placement in a manner that emphasizes minimizing wire length of critical paths and subsequently legalizing critical components as well as non-critical components. Responsive to these steps, the EDA system can perform incremental timing optimization.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The invention can take the form of an entirely hardware embodiment, an entirely software embodiment or an embodiment containing both hardware and software elements. In a preferred embodiment, the invention is implemented in software, which includes but is not limited to firmware, resident software, microcode, etc.

Furthermore, the invention can take the form of a computer program product accessible from a computer-usable or computer-readable medium providing program code for use by or in connection with a computer or any instruction execution system. For the purposes of this description, a computer-usable or computer readable medium can be any tangible apparatus that can contain, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories, which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A computer implemented method for placing components for an integrated circuit, the computer implemented method comprising:
    receiving a plurality of nets, wherein each net is comprised of at least one pin, wherein each pin is linked to a net to form a path of at least a first pin and a second pin, wherein the first pin is a member of a first net, wherein the second pin is a member of a second net, and wherein the path is associated with a slack;
    determining whether the path is a critical path based on the slack;
    responsive to a determination that the path is a critical path, reducing at least one wire length of the path;
    moving a non-critical component in order to reduce at least one wire length of the nets that include pins of the non-critical component, responsive to reducing at least one wire length of the path, wherein the non-critical component lacks pins on a critical path;
    legalizing the components on the plurality of nets having a pin selected from the first pin and the second pin;
    determining whether a component is a non-critical component;
    responsive to a determination that component is a non-critical component, legalizing the non-critical component; and
    responsive to legalizing the non-critical component, incrementally optimizing a time delay of the plurality of paths.

2. The computer implemented method of claim 1, wherein moving a non-critical component further comprises:
    determining whether a second net having a pin as a member of a second path is contributing to congestion; and
    responsive to a determination that the second net has a pin as a member of the second path is contributing to congestion, moving the second net.

3. The computer implemented method of claim 2, wherein moving a non-critical component further comprises moving the non-critical component to a bin adjacent a bin currently assigned to the non-critical component.

4. The computer implemented method of claim 2, wherein determining whether a second net having a pin as a member of the second path is contributing to congestion further comprises determining that a subset of pins, that includes the second net, exceeds a threshold number of pins in a bin to which the subset is assigned.

5. The computer implemented method of claim 1, further comprising:
    determining whether a timing threshold is not met for the plurality of paths; and
    responsive to a determination that the timing threshold is not met, determining whether the path is a critical path based on the slack; and
    responsive to a determination that the path is a critical path, reducing at least one wire length of the path.

6. The computer implemented method of claim 5, wherein the timing threshold is a minimum number of improvements in timing during a predetermined number of iterations.

7. The computer implemented method of claim 6, further comprising, in response to a determination that the timing threshold is met, routing the plurality of nets.

8. The computer implemented method of claim 7, wherein legalizing the non-critical component comprises:
    selecting at least one rule for the rules selected from the group no components overlap, snapping pins to circuit rows, and setting proper component orientation within circuit rows.

9. The computer implemented method of claim 1, wherein reducing at least one wire length of the path further comprises:
    reducing a change in slope between adjacent segments of the path.

10. A computer program product for placing components for an integrated circuit, the computer program product comprising: at least one or more tangible storage devices a computer usable medium having computer usable program code embodied therewith, the computer program product comprising:
    computer usable program code stored on at least one of the one or more tangible storage devices configured to receive a plurality of nets wherein each net is comprised of at least one pin, wherein each pin is linked to a net to form a path of at least a first pin and a second pin, wherein the first pin is a member of a first net, wherein the second pin is a member of a second net, and wherein the path is associated with a slack;
    computer usable program code stored on at least one of the one or more tangible storage devices configured to determine whether the path is a critical path based on the slack;
    computer usable program code stored on at least one of the one or more tangible storage devices configured to reduce at least one wire length of the path, responsive to a determination that the path is a critical path;
    computer usable program code stored on at least one of the one or more tangible storage devices configured to move a non-critical component in order to reduce at least one wire length of the nets that include pins of the non-critical component, responsive to reducing at least one wire length of the path, wherein the non-critical component lacks pins on a critical path;
    computer usable program code stored on at least one of the one or more tangible storage devices configured to legalize components on the plurality of nets having a pin selected from the first pin and the second pin;
    computer usable program code stored on at least one of the one or more tangible storage devices configured to determine whether a component is a non-critical component;
    computer usable program code stored on at least one of the one or more tangible storage devices configured to legalize the non-critical component, responsive to a determination that component is a non-critical component; and
computer usable program code stored on at least one of the one or more tangible storage devices configured to incrementally optimize a time delay of the plurality of paths, responsive to legalizing the non-critical components.

11. The computer program product of claim 10, wherein computer usable program code, stored on at least one of the one or more tangible storage devices, configured to move a non-critical component further comprises:
computer usable program code, stored on at least one of the one or more tangible storage devices, configured to determine whether a second net having a pin as a member of a second path is contributing to congestion; and
computer usable program code, stored on at least one of the one or more tangible storage devices, configured to move the second net, responsive to a determination that the second net has a pin as a member of the second path is contributing to congestion.

12. The computer program product of claim 11, wherein computer usable program code, stored on at least one of the one or more tangible storage devices, configured to moving a non-critical component further comprises computer usable program code stored on at least one of the one or more tangible storage devices configured to move the non-critical component to a bin adjacent a bin currently assigned to the non-critical component.

13. The computer program product of claim 11, wherein computer usable program code, stored on at least one of the one or more tangible storage devices, configured to determine whether a second net having a pin as a member of the second path is contributing to congestion further comprises computer usable program code configured to determine that a subset of pins, that includes the second net, exceeds a threshold number of pins in a bin to which the subset is assigned.

14. The computer program product of claim 10, further comprising:
computer usable program code, stored on at least one of the one or more tangible storage devices, configured to determine whether a timing threshold is not met for the plurality of paths;
computer usable program code, stored on at least one of the one or more tangible storage devices, configured to determine whether the path is a critical path based on the slack, responsive to a determination that the timing threshold is not met; and
computer usable program code, stored on at least one of the one or more tangible storage devices, configured to reduce at least one wire length of the path, responsive to a determination that the path is a critical path.

15. The computer program product of claim 14, wherein the timing threshold is a minimum number of improvements in timing during a predetermined number of iterations.

16. The computer program product of claim 15, further comprising computer usable program code, stored on at least one of the one or more tangible storage devices, configured to route the plurality of nets in response to a determination that the timing threshold is met.

17. The computer program product of claim 16, wherein computer usable program code, stored on at least one of the one or more tangible storage devices, configured to legalize the non-critical component comprises:
computer usable program code, stored on at least one of the one or more tangible storage devices, configured to select at least one rule for the rules selected from the group no components overlap, snapping pins to circuit rows, and setting proper component orientation within circuit rows.

18. The computer program product of claim 10, wherein computer usable program code stored on at least one of the one or more tangible storage devices configured to reduce reducing at least one wire length of the path further comprises:
computer usable program code, stored on at least one of the one or more tangible storage devices, configured to reduce a change in slope between adjacent segments of the path.

19. A data processing system comprising:
a bus;
a storage device connected to the bus, wherein computer usable code is located in the storage device;
a communication unit connected to the bus; and
a processing unit connected to the bus, wherein the processing unit executes the computer usable code for placing components for an integrated circuit, the processing unit further executes the computer usable code to receive a plurality of nets, wherein each net is comprised of at least one pin, wherein each pin is linked to a net to form a path of at least a first pin and a second pin, wherein the first pin is a member of a first net, wherein the second pin is a member of a second net, and wherein the path is associated with a slack; determine whether the path is a critical path based on the slack; reduce at least one wire length of the path, responsive to a determination that the path is a critical path; move a non-critical component in order to reduce at least one wire length of the nets that include pins of the non-critical component, responsive to reducing at least one wire length of the path, wherein the non-critical component lacks pins on a critical path; legalize components on the plurality of nets having a pin selected from the first pin and the second pin; determine whether a component is a non-critical component; legalize the non-critical component, responsive to a determination that component is a non-critical component; and incrementally optimize a time delay of the plurality of paths, responsive to legalizing the non-critical components.

20. The data processing system claim 19, wherein in executing computer usable code to move a non-critical component, processor executes computer usable code to determine whether a second net having a pin as a member of a second path is contributing to congestion; and move the second net, responsive to a determination that the second net has a pin as a member of the second path is contributing to congestion.

21. The data processing system claim 20, wherein in executing computer usable code to move a non-critical component, the processor executes computer usable code to move the non-critical component to a bin adjacent to a bin adjacent a bin currently assigned to the non-critical component.

22. The data processing system claim 20, wherein in executing computer usable code to determine whether a second net having a pin as a member of the second path is contributing to congestion, the processor executes computer usable code to further comprises computer usable program code configured to determine that a subset of pins, that includes the second net, exceeds a threshold number of pins in a bin to which the subset is assigned.

23. The data processing system claim 19, wherein the processor further executes computer usable code to determine whether a timing threshold is not met for the plurality of paths; determine whether the path is a critical path based on the slack, responsive to a determination that the timing threshold is not met; and reduce at least one wire length of the path, responsive to a determination that the path is a critical path.

24. The data processing system claim 23, wherein the timing threshold is a minimum number of improvements in timing during a predetermined number of iterations.

25. The data processing system claim 24, wherein, in executing computer usable code to route the plurality of net lists, the processor executes computer usable code to route in response to a determination that the timing threshold is met.

* * * * *